United States Patent
Chi et al.

(10) Patent No.: US 12,027,201 B2
(45) Date of Patent: Jul. 2, 2024

(54) COLUMN SELECT SIGNAL CELL CIRCUIT, BIT LINE SENSE CIRCUIT AND MEMORY

(71) Applicant: CHANGXIN MEMORY TECHNOLOGIES, INC., Hefei (CN)

(72) Inventors: Sungsoo Chi, Hefei (CN); Jia Wang, Hefei (CN); Ying Wang, Hefei (CN); Shuyan Jin, Hefei (CN); Fengqin Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 36 days.

(21) Appl. No.: 17/743,497

(22) Filed: May 13, 2022

(65) Prior Publication Data

US 2022/0277785 A1   Sep. 1, 2022

Related U.S. Application Data

(63) Continuation of application No. PCT/CN2021/112609, filed on Aug. 13, 2021.

(30) Foreign Application Priority Data

Sep. 18, 2020   (CN) .......................... 202010986823.1

(51) Int. Cl.
   *G11C 11/4094* (2006.01)
   *G11C 11/4091* (2006.01)
(52) U.S. Cl.
   CPC ...... *G11C 11/4094* (2013.01); *G11C 11/4091* (2013.01)
(58) Field of Classification Search
   CPC .................................................. G11C 11/4094
   (Continued)

(56) References Cited

U.S. PATENT DOCUMENTS 5,664,525 A   9/1997   Phillips
5,771,194 A   6/1998   Maeno
(Continued)

FOREIGN PATENT DOCUMENTS

CN   1137677 A   12/1996
CN   1191370 A   8/1998
(Continued)

OTHER PUBLICATIONS

First Office Action of the Chinese application No. 202010987632.7, dated May 22, 2023. 9 pages with English abstract.
(Continued)

*Primary Examiner* — Hoai V Ho
(74) *Attorney, Agent, or Firm* — Kilpatrick Townsend & Stockton LLP

(57) ABSTRACT

A column select signal cell circuit, a bit line sense circuit and a memory are disclosed. The column select signal cell circuit includes four column select cells, each of which includes 4*N input and output ports, 4*N bit line connection ports and one control port. The control ports of a first column select cell and a fourth column select cell are connected to a first column select signal, and the control ports of a second column select cell and a third column select cell are connected to a second column select signal. The bit line connection ports of the first column select cell and the third column select cell are connected to 8*N bit lines of a first storage unit group, the bit line connection ports of the second column select cell and the fourth column select cell are connected to 8*N bit lines of a second storage unit group.

20 Claims, 13 Drawing Sheets

(58) Field of Classification Search
USPC .......................................................... 365/207
See application file for complete search history.

(56) References Cited

U.S. PATENT DOCUMENTS

| | | | |
|---|---|---|---|
| 6,344,990 | B1 | 2/2002 | Matsumiya |
| 6,373,753 | B1 | 4/2002 | Proebsting |
| 6,469,945 | B2 | 10/2002 | Patti |
| 6,510,537 | B1 | 1/2003 | Lee |
| 6,608,772 | B2 | 8/2003 | Ooishi |
| 7,218,558 | B2 | 5/2007 | Kang |
| 7,388,798 | B2 | 6/2008 | Kim |
| 7,564,726 | B2 | 7/2009 | Kouno |
| 7,603,592 | B2 | 10/2009 | Sekiguchi |
| 7,768,844 | B2 | 8/2010 | Takase |
| 7,974,138 | B2 | 7/2011 | Kouno |
| 8,120,972 | B2 | 2/2012 | Kim |
| 8,296,628 | B2 | 10/2012 | Madan |
| 8,416,636 | B2 | 4/2013 | Carman |
| 8,737,149 | B2 | 5/2014 | Riho |
| 9,042,173 | B2 | 5/2015 | Stiegler |
| 9,251,886 | B2 | 2/2016 | Fukushi |
| 10,692,586 | B2 | 6/2020 | Seo et al. |
| 10,918,033 | B2 | 2/2021 | Von Rundstedt |
| 11,282,568 | B2 | 3/2022 | Maejima |
| 2001/0048625 | A1 | 12/2001 | Patti |
| 2003/0046632 | A1 | 3/2003 | Hatakenaka et al. |
| 2004/0184304 | A1 | 9/2004 | Kajigaya |
| 2006/0034122 | A1 | 2/2006 | Betser |
| 2006/0044918 | A1 | 3/2006 | Kang |
| 2007/0038919 | A1 | 2/2007 | Sekiguchi |
| 2007/0195626 | A1 | 8/2007 | Kim |
| 2008/0037309 | A1 | 2/2008 | Makino |
| 2008/0037336 | A1 | 2/2008 | Kouno |
| 2008/0056041 | A1 | 3/2008 | Liaw |
| 2009/0089646 | A1 | 4/2009 | Hirose |
| 2009/0257293 | A1 | 10/2009 | Kouno |
| 2010/0226192 | A1 | 9/2010 | Moon |
| 2011/0085364 | A1 | 4/2011 | Shimano |
| 2013/0135915 | A1 | 5/2013 | Kim |
| 2015/0070965 | A1* | 3/2015 | Bandyopadhyay .. H10N 70/823 365/148 |
| 2016/0254059 | A1 | 9/2016 | Ochi |
| 2017/0140810 | A1 | 5/2017 | Choi |
| 2018/0268917 | A1 | 9/2018 | Lee |
| 2020/0043566 | A1 | 2/2020 | Seo et al. |
| 2020/0185026 | A1 | 6/2020 | Yun et al. |
| 2022/0277785 | A1 | 9/2022 | Chi |

FOREIGN PATENT DOCUMENTS

| | | |
|---|---|---|
| CN | 1389921 A | 1/2003 |
| CN | 1404065 A | 3/2003 |
| CN | 1407558 A | 4/2003 |
| CN | 1421870 A | 6/2003 |
| CN | 1744230 A | 3/2006 |
| CN | 1841552 A | 10/2006 |
| CN | 1909114 A | 2/2007 |
| CN | 101123115 A | 2/2008 |
| CN | 101136242 A | 3/2008 |
| CN | 101136253 A | 3/2008 |
| CN | 101404184 A | 4/2009 |
| CN | 102682833 A | 9/2012 |
| CN | 103377708 A | 10/2013 |
| CN | 105931666 A | 9/2016 |
| CN | 106663461 A | 5/2017 |
| CN | 107430879 A | 12/2017 |
| CN | 108346452 A | 7/2018 |
| CN | 109903795 A | 6/2019 |
| CN | 110797073 A | 2/2020 |
| EP | 2500906 A1 | 9/2012 |
| EP | 3262653 A1 | 1/2018 |
| JP | H0554635 A | 3/1993 |
| JP | H10326497 A | 12/1998 |
| JP | 2004062997 A | 2/2004 |
| KR | 20050057977 A | 6/2005 |
| WO | 2016182753 A1 | 11/2016 |

OTHER PUBLICATIONS

First Office Action of the U.S. Appl. No. 17/476,583, dated Jul. 18, 2023. 47 pages.
English translation of the Written Opinion of the International Search Authority in the international application No. PCT/CN2021/107924, dated Oct. 25, 2021. 4 pages.
English translation of the Written Opinion of the International Search Authority in the international application No. PCT/CN2021/112609, dated Oct. 26, 2021. 4 pages.
Supplementary European Search Report in the European application No. 21868367.0, dated Feb. 22, 2024. 8 pages.
English Translation of the International Search Report cited in PCT/CN2021/112609, dated Oct. 26, 2021, 3 pages.
English Translation of the International Search Report cited in PCT/CN2021/107924, dated Oct. 25, 2021, 2 pages.
European Patent Office, the Extended European Search Report Issued in Application No. 21868267.2, May 23, 2024, Germany, 9 pages.

* cited by examiner

COLUMN SELECT SIGNAL CELL CIRCUIT, BIT LINE SENSE CIRCUIT AND MEMORY

CROSS-REFERENCE TO RELATED APPLICATION

This is a continuation application of International Patent Application No. PCT/CN2021/112609, filed on Aug. 13, 2021, which is based upon and claims priority to Chinese Patent Application No. 202010986823.1, filed on Sep. 18, 2020. The entire contents of International Patent Application No. PCT/CN2021/112609 and Chinese Patent Application No. 202010986823.1 are incorporated herein by reference.

TECHNICAL FIELD

Embodiments of the present application relate to, but are not limited to, a column select signal cell circuit, a bit line sense circuit and a memory.

BACKGROUND

A Dynamic Random Access Memory (DRAM) includes storage units (storage bits) arranged in an array. Each storage unit includes a transistor and a capacitor. The transistor acts as a switch between the capacitor and a bit line, and may be activated by a word line coupled to a control end of the transistor. The storage unit can store binary information as a charge on the capacitor. A sense amplifier is connected to the storage unit, and a weak signal stored in the storage unit can be amplified, so that data stored in the storage unit can be correctly written or read.

However, in the manufacturing process of storage arrays of a memory, capacitors of adjacent storage units are susceptible to defects simultaneously, referred to as a 2 bits error, due to process reasons.

The DRAM may correct data errors in the memory through an Error Correcting Code (ECC), but the ECC can only correct a 1 bit error, and the 2 bits error exceeds the error correcting capability of the ECC.

SUMMARY

In a first aspect, embodiments of the present application provide a column select signal cell circuit. The column select signal cell circuit includes: a first column select cell, a second column select cell, a third column select cell and a fourth column select cell, each of which includes 4*N input and output ports, 4*N bit line connection ports and one control port. The control ports of the first column select cell and the fourth column select cell are electrically connected to a first column select signal, the control ports of the second column select cell and the third column select cell are electrically connected to a second column select signal. The bit line connection ports of the first column select cell and the third column select cell are respectively connected to 8*N bit lines of a first storage unit group, the bit line connection ports of the second column select cell and the fourth column select cell are respectively connected to 8*N bit lines of a second storage unit group. The first storage unit group and the second storage unit group are adjacently arranged, and N is an integer greater than or equal to 1.

In a second aspect, embodiments of the present application further provide a column select signal cell circuit. The column select signal cell circuit includes: a fifth column select cell, a sixth column select cell, a seventh column select cell and an eighth column select cell, each of which includes 4*N input and output ports, 4*N bit line connection ports and one control port. The fifth column select cell is electrically connected to a first column select signal, the control ports of the sixth column select cell and the seventh column select cell are electrically connected to a second column select signal, the eighth column select cell is electrically connected to a third column select signal. The bit line connection ports of the fifth column select cell are respectively connected to 4*N bit lines of a first storage unit group, the bit line connection ports of the sixth column select cell are respectively connected to 4*N bit lines of a second storage unit group, the bit line connection ports of the seventh column select cell are respectively connected to 4*N bit lines of the first storage unit group, the bit line connection ports of the eighth column select cell are respectively connected to 4*N bit lines of the second storage unit group. The first storage unit group and the second storage unit group are adjacently arranged, and N is an integer greater than or equal to 1.

In a third aspect, embodiments of the present application provide a bit line sense circuit, which may include: L storage unit groups, each storage unit group including H bit lines, and L and H being positive integers greater than or equal to 2; and M sense amplifier groups, configured to write storage data to or read storage data from the bit lines in the storage unit groups, the M sense amplifier groups being electrically connected to the L storage unit groups, and M being an integer multiple of L or L being an integer multiple of M. Each sense amplifier group includes the column select signal cell circuit according to any embodiment of the present application, and two adjacent bit lines of the H bit lines are connected to the different sense amplifier groups.

In a fourth aspect, embodiments of the present application provide a memory, which may include: the bit line sense circuit in any one of the above-described embodiments of the present application. Each of the storage unit groups further includes one word line. The one word line and the H bit lines further correspond to H transistors and H capacitors. The one word line controls the H transistors to be turned on or off. The H bit lines are connected to first ends of the H transistors. Second ends of the H transistors are connected to first ends of the H capacitors. Second ends of the H capacitors are connected to a fixed voltage.

DETAILED DESCRIPTION

The present application is further described in detail below in combination with the accompanying drawings and embodiments. It can be understood that the specific embodiments described here are merely to explain the present application and not intended to limit the present application. In addition, it should further be noted that for the purpose of facilitating the description, not all of structures related to the present application are illustrated only in the accompanying drawings.

According to some embodiments of the present application, a memory includes storage unit arrays including storage units arranged along a word line direction and a bit line direction. As for the storage units connected to the same word line, every adjacent multiple storage units form a storage unit group. For example, adjacent 8 storage units form one storage unit group. The word lines and the bit lines are arranged in a crossed manner, each word line is connected to a corresponding row of storage units to switch on the row of storage units, and each bit line is connected to a corresponding column of storage units to write or read data.

The following clearly and completely describes the technical solutions in the embodiments of the present application with reference to the accompanying drawings in the embodiments of the present application. All other embodiments obtained by those of ordinary skill in the art based on the embodiments of the present application without creative efforts fall within the scope of protection of the present application.

Figure 11:
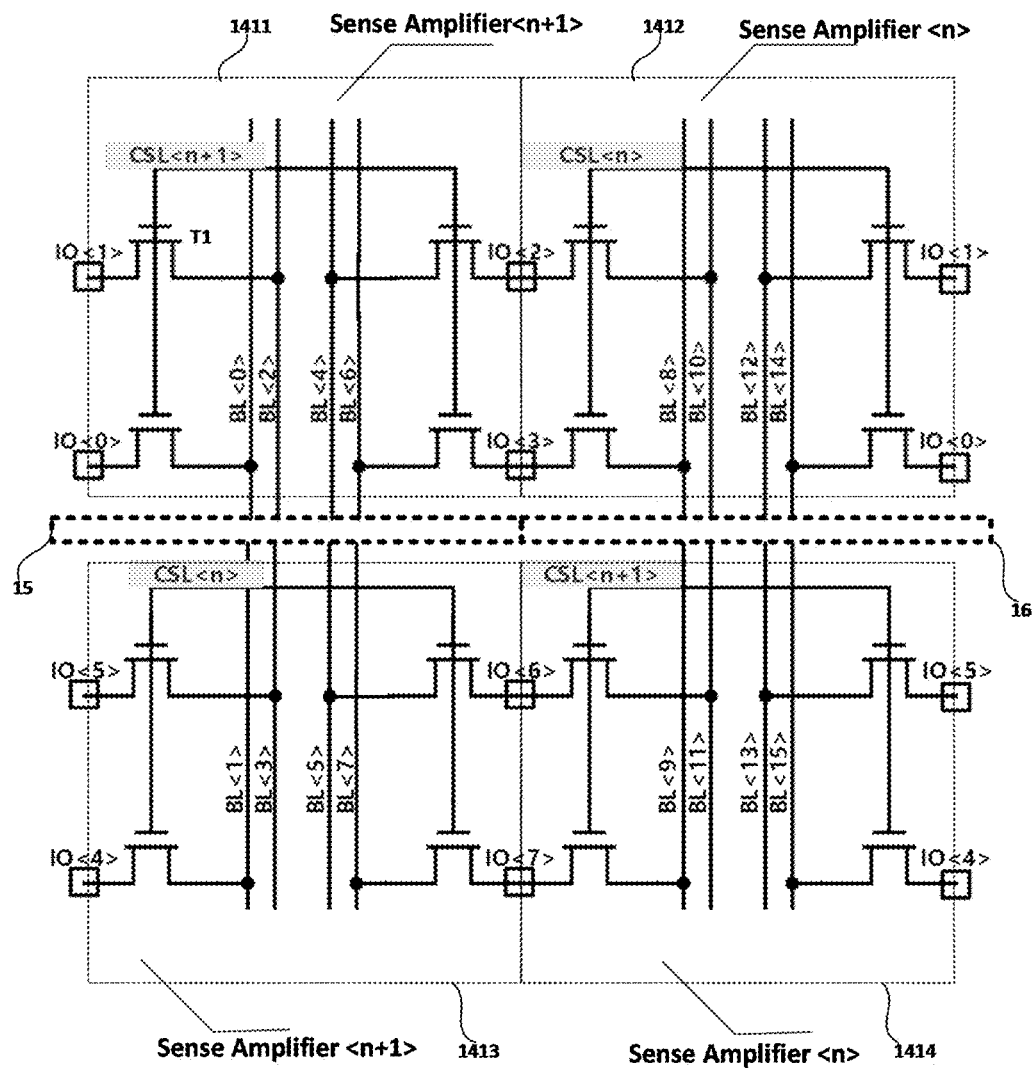
FIG. 11 illustrates a schematic structural diagram of a column select signal cell circuit provided by an embodiment of the present application.

An embodiment of the present application provides a column select signal cell circuit, as illustrated in FIG. 11. FIG. 11 illustrates a schematic structural diagram of the column select signal cell circuit provided by the embodiment of the present application. The column select signal cell circuit includes:

a first column select cell 1411, a second column select cell 1412, a third column select cell 1413 and a fourth column select cell 1414, each of which includes 4*N input and output ports, 4*N bit line connection ports and one control port. The control ports of the first column select cell 1411 and the fourth column select cell 1414 are electrically connected to a first column select signal, and the control ports of the second column select cell 1412 and the third column select cell 1413 are electrically connected to a second column select signal. The bit line connection ports of the first column select cell 1411 and the third column select cell 1413 are respectively connected to 8*N bit lines of a first storage unit group 15, and the bit line connection ports of the second column select cell 1412 and the fourth column select cell 1414 are respectively connected to 8*N bit lines of a second storage unit group 16. The first storage unit group 15 and the second storage unit group 16 are adjacently arranged, and N is an integer greater than or equal to 1.

The column select signal cell circuit according to the embodiment of the present application includes four column select cells: the first column select cell 1411, the second column select cell 1412, the third column select cell 1413, and the fourth column select cell 1414. Each column select cell may include 4*N input and output ports, 4*N bit line connection ports, and one control port. The 4*N bit line connection ports are respectively connected to 4*N bit lines in the storage unit group. The 4*N input and output ports correspond to the 4*N bit line connection ports in a one-to-one correspondence, and can output the read data acquired from the corresponding bit lines through the corresponding bit line connection ports, or write data to the bit lines through the corresponding bit line connection ports. The control port can control whether the 4*N input and output ports and the 4*N bit line connection ports perform reading or writing work. Exemplarily, each column select cell may include 4*N switch tubes T1, and N may be 1, then each column select cell may include 4 switch tubes T1. The first end of each switch tube T1 is used as a bit line connection port, a second terminal of each switch tube T1 is used as an input and output port, and control terminals of the 4 switch tubes T1 are interconnected to form one control port, which is capable of receiving column select signals for controlling the switch tubes T1 to be switched on or off.

As illustrated in FIG. 11, according to the embodiment of the present application, the control ports of the first column select cell 1411 and the fourth column select cell 1414 are electrically connected to the first column select signal CSL<n+1>, and the control ports of the second column select cell 1412 and the third column select cell 1413 are electrically connected to the second column select signal CSL<n>, so that the first column select cell 1411 and the fourth column select cell 1414 operate simultaneously, and the second column select cell 1412 and the third column select cell 1413 operate simultaneously. Moreover, the bit line connection ports of the first column select cell 1411 and the third column select cell 1413 are respectively connected to 8*N bit lines of the first storage unit group 15, and the bit lines in the first storage unit group 15 are connected to different sense amplifier groups (the column select cells in the same sense amplifier group are connected to the same column select signal). When reading errors occur on two adjacent bit lines simultaneously, the error data can be detected by different sense amplifier groups, which facilitates locking the two bit lines on which the errors occur, and further locking the two storage units on which the errors occur in the first storage unit group 15. Similarly, the bit line connection ports of the second column select cell 1412 and the fourth column select cell 1414 are respectively connected to 8*N bit lines of the second storage unit group 16, which facilitates locking the two storage units on which the errors occur in the second storage unit group 16. According to the technical scheme, under the condition that the existing error correction capability is not changed, the detection and correction of the adjacent 2 bits error in the memory are realized, and the memory performance is improved. According to the embodiment, the first storage unit group 15 and the second storage unit group 16 are adjacently arrange. In general, each storage unit group includes 8 bit lines, and N may be 1, and certainly N may be other values such as 2 and 3, which is not limited herein.

According to some embodiments of the present application, even-numbered bit lines of the first storage unit group 15 are connected to the bit line connection ports of the first column select cell 1411, and odd-numbered bit lines of the first storage unit group 15 are connected to the bit line connection ports of the third column select cell 1413. The even-numbered bit lines of the second storage unit group 16 are connected to the bit line connection ports of the second column select cell 1412, and the odd-numbered bit lines of the second storage unit group 16 are connected to the bit line connection ports of the fourth column select cell 1414.

With further reference to FIG. 11, the bit line connection ports of the first column select cell 1411 may be controlled to be connected to even-numbered bit lines of the first storage unit group 15, and the bit line connection ports of the third column select cell 1413 may be controlled to be connected to odd-numbered bit lines of the first storage unit group 15. As illustrated in FIG. 11, the labels of the bit lines in the first storage unit group 15 are BL<0> to BL<7> in sequence from the beginning to the end, the bit line connection ports of the first column select cell 1411 are connected to BL<0>, BL<2>, BL<4> and BL<6> respectively, and the bit line connection ports of the third column select cell 1413 are connected to BL<1>, BL<3>, B <5> and BL<7> respectively, and then the errors between every two adjacent bit lines in the bit lines BL<0> to BL<7> can be positioned and corrected, thereby further improving the error correction performance of the memory. Similarly, the labels of the bit lines in the second storage unit group 16 are BL<8> to BL<15> in sequence from the beginning to the end, the bit line connection ports of the second column select cell 1412 are connected to BL<8>, BL<10>, BL<12> and BL<14> respectively, the bit line connection ports of the fourth column select cell 1414 are connected to BL<9>, BL<11>, BL<13> and BL<15> respectively, and then the errors between every two adjacent bit lines in the bit lines BL<8> to BL<15> can be positioned and corrected.

According to some embodiments of the present application, the first column select cell 1411 and the second column select cell 1412 are arranged side by side, and the third column select cell 1413 and the fourth column select cell 1414 are arranged side by side. The first column select cell 1411 and the third column select cell 1413 are arranged on two opposite sides of the first storage unit group 15, and the second column select cell 1412 and the fourth column select cell 1414 are arranged on two opposite sides of the second storage unit group 16.

With further reference to FIG. 11, the first column select cell 1411 and the second column select cell 1412 are arranged side by side and located on a first side of the storage units, the third column select cell 1413 and fourth column select cell 1414 are arranged side by side and located on a second side, which is opposite to the first side, of the storage units. The first column select cell 1411 and the third column select cell 1413 are arranged on two opposite sides of the first storage unit group 15, which facilitates being connected to bit lines of the first storage unit group 15, and the second column select cell 1412 and the fourth column select cell 1414 are arranged on two opposite sides of the second storage unit group 16, which facilitates being connected to bit lines of the second storage unit group 16. That is, two column select cells of the same sense amplifier group (connected to the same control port) are arranged in a crossed manner, and each column select cell is arranged close to the corresponding storage unit group in which the connected bit lines are positioned, so that the wiring of the column select cells is simplified.

According to some embodiments of the present application, the first column select cell 1411 and the second column select cell 1412 share 2*N input and output ports, and the third column select cell 1413 and the fourth column select cell 1414 share 2*N input and output ports.

With further reference to FIG. 11, the first column select cell 1411 and the second column select cell 1412 arranged side by side may share 2*N input and output ports, and each input and output port is connected to two switch tubes T1. When N is 1, the first column select cell 1411 and the second column select cell 1412 may share 2 input and output ports. As illustrated in FIG. 11, the switch tube T1 connected to the bit line BL<4> in the first column select cell 1411 and the switch tube T1 connected to the bit line BL<10> in the second column select cell 1412 are connected to each other, and share one input and output port IO<2>. In addition, the first column select cell 1411 and the second column select cell 1412 further share the input and output port IO<3>. Similarly, the third column select cell 1413 and the fourth column select cell 1414 arranged side by side share the input and output ports IO<6> and IO<7>. According to the present application, the arrangement that two adjacent column select cells share the input and output ports can simplify the manufacturing process of the column select signal cell circuit, and the manufacturing cost is saved.

Figure 12:
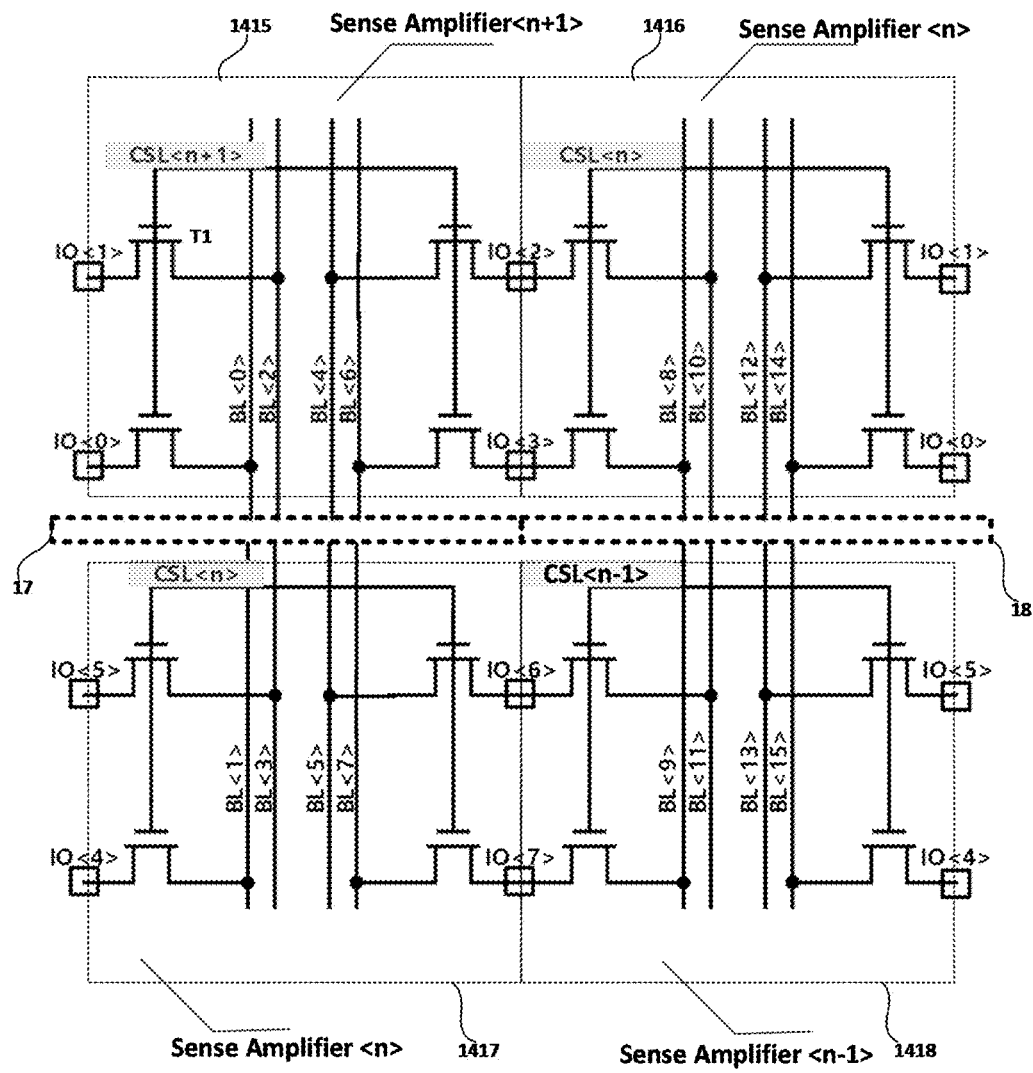
FIG. 12 illustrates a schematic structural diagram of another column select signal cell circuit provided by an embodiment of the present application.
Figure 13:
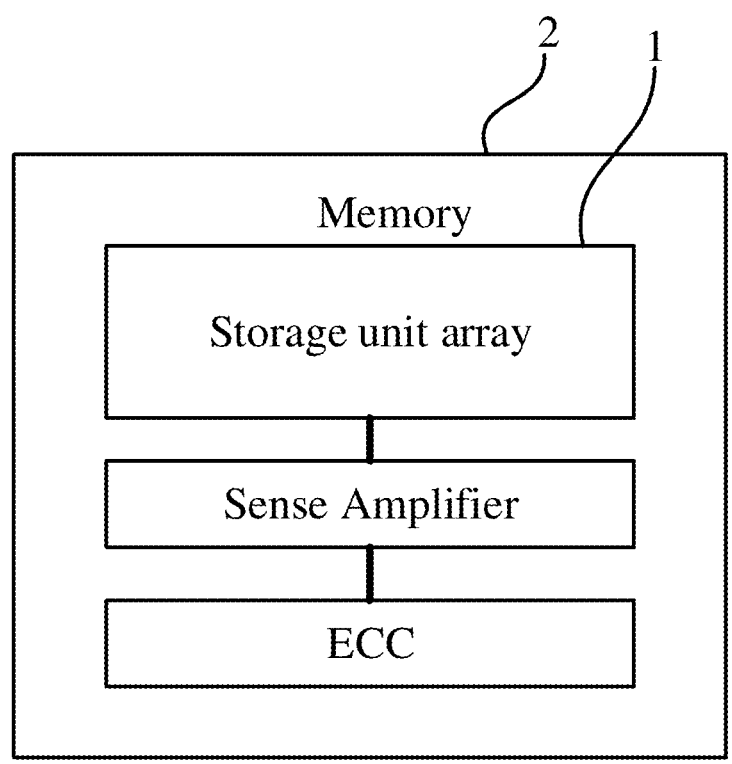
FIG. 13 is a schematic diagram of a memory provided by an embodiment of the present application.

An embodiment of the present application further provides a column select signal cell circuit, as illustrated in FIG. 12. FIG. 12 illustrates a schematic structural diagram of the column select signal cell circuit provided by the embodiment of the present application, and the column select signal cell circuit includes:

a fifth column select cell 1415, a sixth column select cell 1416, a seventh column select cell 1417 and an eighth column select cell 1418, each of which includes 4*N input and output ports, 4*N bit line connection ports and one control port. The fifth column select cell 1415 is electrically connected to a first column select signal, the control ports of the sixth column select cell 1416 and the seventh column select cell 1417 are electrically connected to a second column select signal, and the eighth column select cell 1418 is electrically connected to a third column select signal. The bit line connection ports of the fifth column select cell 1415 are connected to 4*N bit lines of a first storage unit group 15, the bit line connection ports of the sixth column select cell 1416 are connected to 4*N bit lines of a second storage unit group 16, the bit line connection ports of the seventh column select cell 1417 are connected to 4*N bit lines of the first storage unit group 15, and the bit line connection ports of the eighth column select cell 1418 are connected to 4*N bit lines of the second storage unit group 16. The first storage unit group 15 and the second storage unit group 16 are adjacently arranged; and N is an integer greater than or equal to 1.

The column select signal cell circuit according to the embodiment of the present application includes four column select cells: the fifth column select cell 1415, the sixth column select cell 1416, the seventh column select cell 1417, and the eighth column select cell 1418. Each column select cell may include 4*N input and output ports, 4*N bit line connection ports, and one control port. The 4*N bit line connection ports are respectively connected to 4*N bit lines in the storage unit group. The 4*N input and output ports correspond to the 4*N bit line connection ports in a one-to-one correspondence, and can output the read data acquired from the corresponding bit lines through the corresponding bit line connection ports, or write data to the bit lines through the corresponding bit line connection ports. The control port can control whether the 4*N input and output ports and the 4*N bit line connection ports perform reading or writing work. Exemplarily, each column select cell may include 4*N switch tubes T1, and N may be 1, and then each column select cell may include 4 switch tubes TL The first end of each switch tube T1 is used as a bit line connection port, a second terminal of each switch tube T1 is used as an input and output port, and control terminals of the 4 switch tubes T1 are interconnected to form one control port, which is capable of receiving column select signals for controlling the switch tubes T1 to be turned on or off.

As illustrated in FIG. 12, according to the embodiment of the present application, the fifth column select cell 1415 is electrically connected to the first column select signal CSL<n+1>, the control ports of the sixth column select cell 1416 and the seventh column select cell 1417 are electrically connected to the second column select signal CSL<n−1>, and the control port of the eighth column select cell 1418 is electrically connected to the third column select signal CSL<n>. For the four column select cells, the fifth column select cell 1415 operates alone, the sixth column select cell 1416 and the seventh column select cell 1417 operate simultaneously, and the eighth column select cell 1418 operates alone. Moreover, the bit line connection ports of the fifth column select cell 1415 and the seventh column select cell 1417 are respectively connected to 8*N bit lines of the first storage unit group 15, and similarly, the bit line connection ports of the sixth column select cell 1416 and the eighth column select cell 1418 are respectively connected to the 8*N bit lines of the second storage unit group 16. Thus, the bit lines in the first storage unit group 15 are connected to different sense amplifier groups (the column select cells in the same sense amplifier group are connected to the same column select signal), and the bit lines in the second storage unit group 16 are connected to different sense amplifier groups. When reading errors occur on two adjacent bit lines in the first storage unit group 15 or the second storage unit group 16 simultaneously, the error data can be detected by different sense amplifier groups, which facilitates locking two bit lines on which the errors occur, and further locking two storage units on which the errors occur in the first storage unit group 15. According to the technical scheme, under the condition that the existing error correction capability is not changed, the detection and correction of the adjacent 2 bits error in the memory are realized, and the memory performance is improved. According to the embodiment, the first storage unit group 15 and the second storage unit group 16 are adjacently arranged. In general, each storage unit group includes 8 bit lines, and then N may be 1, and certainly N may be other values such as 2 and 3, which is not limited herein.

According to some embodiments of the present application, even-numbered bit lines of the first storage unit group 15 are connected to the bit line connection ports of the fifth column select cell 1415, and odd-numbered bit lines of the first storage unit group 15 are connected to the bit line connection ports of the seventh column select cell 1417. The even-numbered bit lines of the second storage unit group 16 are connected to the bit line connection ports of the sixth column select cell 1416, and odd-numbered bit lines of the second storage unit group 16 are connected to the bit line connection ports of the eighth column select cell 1418.

With further reference to FIG. 12, the bit line connection ports of the fifth column select cell 1415 may be controlled to be connected to even-numbered bit lines of the first storage unit group 15, and the bit line connection ports of the seventh column select cell 1417 may be controlled to be connected to odd-numbered bit lines of the first storage unit group 15. The labels of the bit lines in the first storage unit group 15 are BL<0> to BL<7> in sequence from the beginning to the end, the bit line connection ports of the fifth column select cell 1415 are connected to BL<0>, BL<2>, BL<4> and BL<6> respectively, and the bit line connection ports of the seventh column select cell 1417 are connected to BL<1>, BL<3>, B <5> and BL<7> respectively, and then the errors between every two adjacent bit lines in the bit lines BL<0> to BL<7> can be positioned and corrected, thereby further improving the error correction performance of the memory. Similarly, the labels of the bit lines in the second storage unit group 16 are BL<8> to BL<15> in sequence from the beginning to the end, the bit line connection ports of the sixth column select cell 1416 are connected to BL<8>, BL<10>, BL<12> and BL<14> respectively, the bit line connection ports of the eighth column select cell 1418 are connected to BL<9>, BL<11>, BL<13> and BL<15> respectively, and then the errors between every two adjacent bit lines in the bit lines BL<8> to BL<15> can be positioned and corrected.

According to some embodiments of the present application, the fifth column select cell 1415 and the sixth column select cell 1416 are arranged side by side, and the seventh column select cell 1417 and the eighth column select cell 1418 are arranged side by side. The fifth column select cell 1415 and the seventh column select cell 1417 are arranged at two opposite sides of the first storage unit group 15, and the sixth column select cell 1416 and the eighth column select cell 1418 are arranged at two opposite sides of the second storage unit group 16.

With further reference to FIG. 12, the fifth column select cell 1415 and the sixth column select cell 1416 are arranged side by side and located on a first side of the storage units, the seventh column select cell 1417 and eighth column select cell 1418 are arranged side by side and located on a second side, opposite to the first side, of the storage units. The fifth column select cell 1415 and seventh column select cell 1417 are arranged on two opposite sides of the first storage unit group 15, which facilitates being connected to bit lines of the first storage unit group 15. The sixth column select cell 1416 and the eighth column select cell 1418 are arranged on two opposite sides of the second storage unit group 16, which facilitates being connected to bit lines of the second storage unit group 16. That is, two column select cells of the same sense amplifier group (connected to the same control port) are offset by at least one storage unit group along the arrangement direction of the first storage unit group 15 and the second storage unit group 16 (along the word line direction of the storage unit arrays), and each column select cell is arranged close to the storage unit group in which the connected bit lines are positioned, so that the wiring of the column select cells is simplified.

According to some embodiments of the present application, the fifth column select cell 1415 and the sixth column select cell 1416 share 2*N input and output ports, and the seventh column select cell 1417 and the eighth column select cell 1418 share 2*N input and output ports.

With further reference to FIG. 12, the fifth column select cell 1415 and the sixth column select cell 1416 arranged side by side may share 2*N input and output ports, and each input and output port is connected to two switch tubes T1. When N is 1, the fifth column select cell 1415 and the sixth column select cell 1416 may share 2 input and output ports. As illustrated in FIG. 12, the switch tube T1 connected to the bit line BL<4> in the fifth column select cell 1415 and the switch tube T1 connected to the bit line BL<10> in the sixth column select cell 1416 are connected to each other, and share the input and output port IO<2>. In addition, the fifth column select cell 1415 and the sixth column select cell 1416 further share the input and output port IO<3>. Similarly, the seventh column select cell 1417 and the eighth column select cell 1418 arranged side by side share the input and output ports IO<6> and IO<7>. According to the present application, the arrangement that two adjacent column select cells share the input and output ports can simplify the manufacturing process of the column select signal cell circuit, and the manufacturing cost is saved.

Based on the foregoing embodiments, an embodiment of the present application further provides a bit line sense circuit. The bit line sense circuit includes:

L storage unit groups, each storage unit group including H bit lines, and L and H being positive integers greater than or equal to 2; and M sense amplifier groups, configured to write memory data to or read memory data from the bit lines in the storage unit groups, the M sense amplifier groups being electrically connected to the L storage unit groups, and M being an integer multiple of L or L being an integer multiple of M. Each sense amplifier group includes the column select signal cell circuit according to any embodiment of the present application. Two adjacent bit lines of the H bit lines are connected to different sense amplifier groups.

Figure 1:
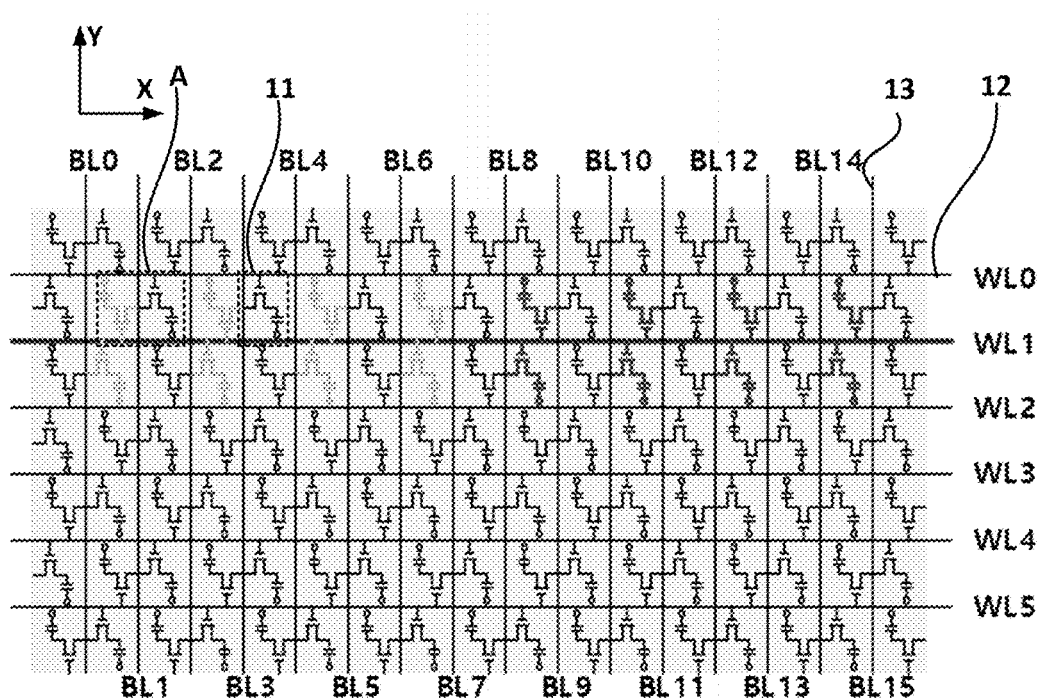
FIG. 1 is a schematic circuit diagram of a storage array of a bit line sense circuit provided by an embodiment of the present application.

FIG. 1 is a schematic circuit diagram of a storage array of a bit line sense circuit provided by an embodiment of the present application. As illustrated in FIG. 1, the bit line sense circuit includes a storage unit array arranged along a word line direction X and a bit line direction Y. The storage unit array includes a plurality of storage units 11. The bit line sense circuit further includes a plurality of word lines 12 and a plurality of bit lines 13. The word lines 12 extend along the word line direction X. Each word line 12 corresponds to storage units 11 and is used for switching on the corresponding storage units 11. The bit lines 13 extend along the bit line direction Y. Each bit line 13 is connected to the corresponding storage units 11 to write data to or read data from the corresponding storage units 11. The plurality of word lines 12 and the plurality of bit lines 13 described above intersect to define a region of each storage unit 11. Exemplarily, as illustrated in FIG. 1, the bit line sense circuit in FIG. 1 shows six word lines WL0-WL5 sequentially arranged along the bit line direction Y and sixteen bit lines BL0-BL15 sequentially arranged along the word line direction X, which intersect to define respective storage units 11. In the embodiment of the present application, the storage units 11 connected to the same word line 12 may be defined, every n adjacent storage units 11 form one storage unit group, and n is an integer greater than 1. For example, when data storage is achieved by the bit line sense circuit, data storage is often performed by every eight storage units. Therefore, the embodiment of the present application may define every eight adjacent storage units 11 to form one storage unit group, thereby facilitating detection and amplification processing. That is, every eight adjacent storage units 11 in each row of storage units 11 form one storage unit group. It should be noted that each row of storage units refers to the storage units 11 sequentially arranged along an extension direction of the word line direction X, and respective storage units may be arranged in a straight line or in a curve.

Figure 2:
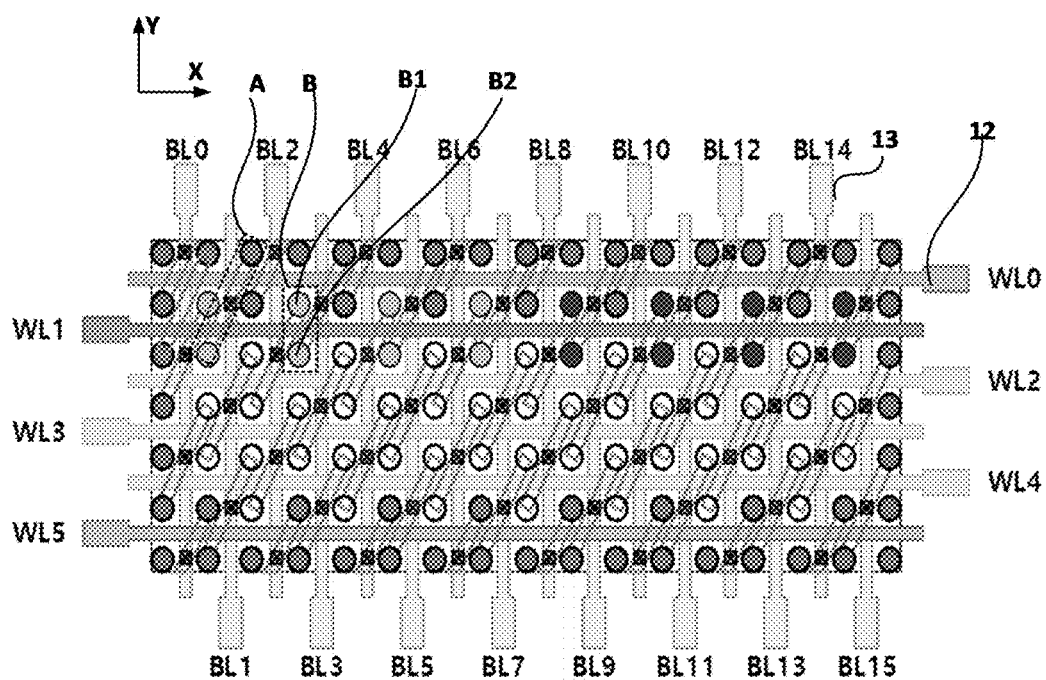
FIG. 2 is a schematic structure diagram of a storage array of a bit line sense circuit provided by an embodiment of the present application.
Figure 3:
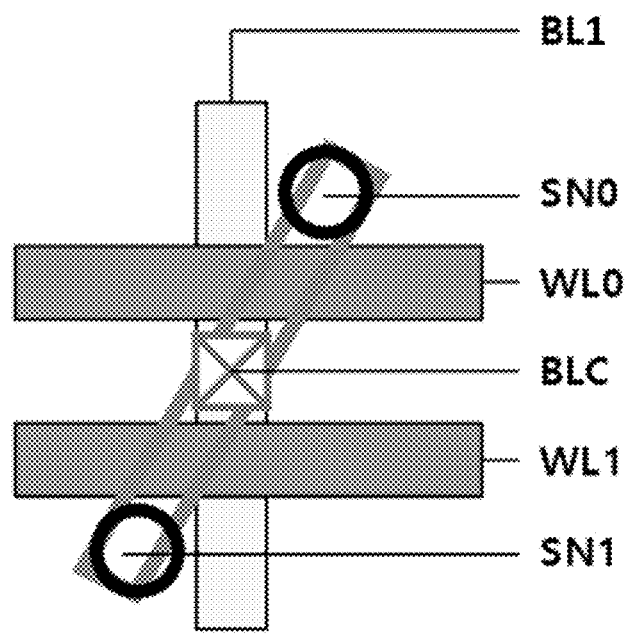
FIG. 3 is an enlarged partial schematic diagram of a region A in FIG. 2.
Figure 4:
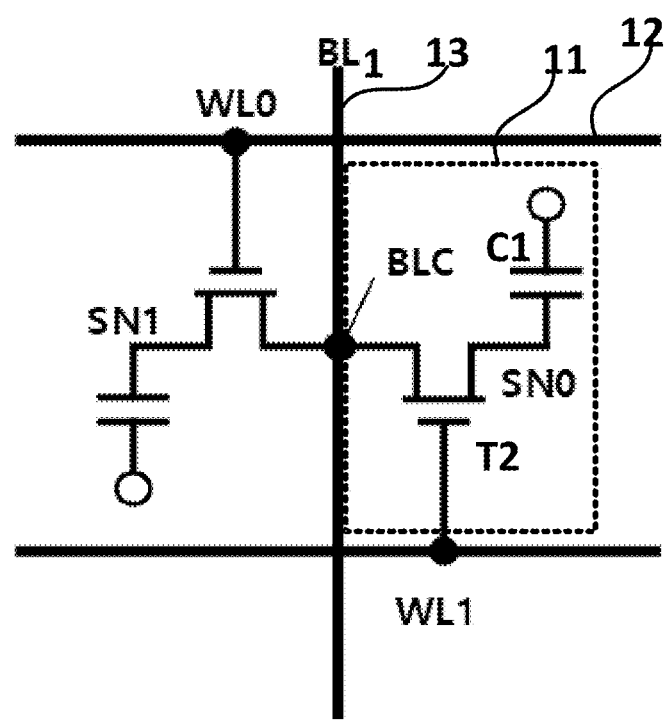
FIG. 4 is an enlarged partial schematic diagram of a region A in FIG. 1.

FIG. 2 is a schematic structure diagram of a storage array of a bit line sense circuit provided by an embodiment of the present application. Each storage unit is simplified in FIG. 1 in the form of circuit symbols, and is illustrated in FIG. 2 in the form of a circuit layout. In the actual manufacturing process of the bit line sense circuit, as illustrated in the schematic structural diagram of FIG. 2, it can be seen that two adjacent storage units illustrated in FIG. 1 are not actually connected to the same word line or the same bit line. In FIG. 2, two adjacent storage units in a Y direction are actually connected to two adjacent bit lines. For example, a storage unit in an upper portion of a region A is connected to a bit line BL1, while the adjacent storage unit in the Y direction is connected to a bit line BL2. For example, a storage unit B1 in a region B is connected to the bit line BL2, a storage unit B2 in the region B is connected to a bit line BL3, and the storage unit B1 and the storage unit B2 are adjacent storage units in the Y direction. As illustrated in FIGS. 3 and 4, FIG. 3 is an enlarged partial schematic diagram of a region A in FIG. 2. FIG. 4 is an enlarged partial schematic diagram of a region A in FIG. 1. Two adjacent storage units 11 connected to the same bit line BL1 are illustrated in FIG. 4.

As illustrated in FIG. 4, in some embodiments of the present application, each storage unit 11 may include a second transistor T2 and a capacitor C1. The second transistor T2 includes a control end, a first end, and a second end. The control end of the second transistor T2 is connected with a corresponding word line 12, i.e. WL1, for being turned on or off under the control of a level on the word line 12. The first end of the second transistor T2 is connected to a corresponding bit line 13. The second end of the second transistor T2 is connected to a capacitor C1 of the storage unit 11 in which the second transistor T2 is located, for connecting the bit line 13 to the capacitor C1 in an on state, so that data on the bit line 13 is written into the capacitor C1, or data stored in the capacitor C1 is read and transferred to the bit line 13. As illustrated in FIGS. 3 and 4, the storage unit 11 is connected to the bit line BL1 through a Bit Line Contact (BLC).

Figure 5:
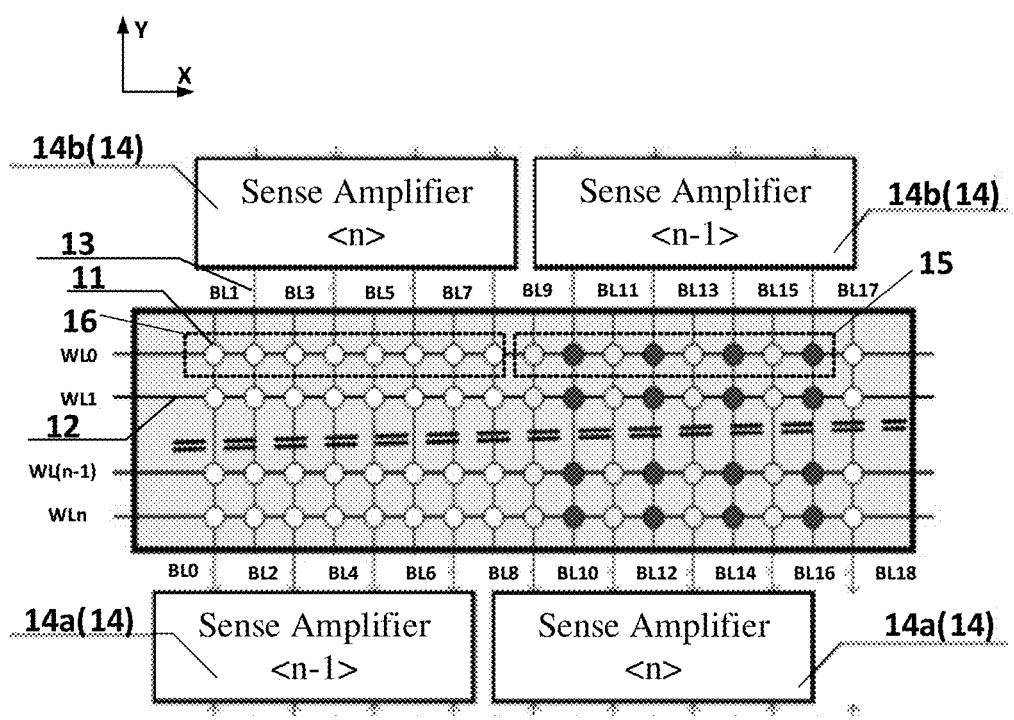
FIG. 5 is a schematic structure diagram of another bit line sense circuit provided by an embodiment of the present application.

As illustrated in FIG. 5, the embodiments of the present application provide a bit line sense circuit, which includes L storage unit groups 15 and M sense amplifier groups 14. Each of the storage unit groups 15 includes H bit lines 13. Both L and H are positive integers greater than or equal to 2. The M sense amplifier groups 14 are configured to write or read storage data to or from the bit lines in the storage unit groups 15. The M sense amplifier groups 14 are electrically connected to the L storage unit groups 15. M is an integer multiple of L or L is an integer multiple of M. Two adjacent bit lines of the H bit lines are connected to the different sense amplifier groups 14.

In some embodiments of the present application, H is an integer multiple of 8 and M is equal to L. In one embodiment, for example, H is equal to 8, and both M and L are equal to 2.

In some embodiments of the present application, each of the sense amplifier groups 14 includes a first sense amplifier 14*a* and a second sense amplifier 14*b*. The L storage unit groups 15 are arranged side by side along a word line 12 direction, and the word lines 12 are perpendicular to the bit lines 13. The first sense amplifier 14*a* is located on one side of the storage unit groups 15, and the second sense amplifier 14*b* is located on an opposite side of the storage unit groups 15.

FIG. 5 is a schematic structure diagram of a bit line sense circuit provided by an embodiment of the present application. As illustrated in FIG. 5, the bit line sense circuit further includes a plurality of sense amplifier groups 14. Each sense amplifier group 14 corresponds to a plurality of bit lines 13, and the sense amplifier group 14 is connected to the corresponding plurality of bit lines 13, thereby amplifying data stored in the storage unit 11 to which the bit lines 13 are connected. For example, in FIG. 5, a sense amplifier group Sense Amplifier<n> corresponds to eight bit lines 13 (BL2, BL4, BL6, BL8, BL9, BL11, BL13, and BL15), and is connected to the corresponding eight bit lines 13. A sense amplifier group Sense Amplifier<n−1> corresponds to other eight bit lines 13 (BL1, BL3, BL5, BL7, BL10, BL12, BL14, and BL16), and is connected to the corresponding other eight bit lines 13. Taking FIG. 5 as an example, among the eight bit lines 13 (BL9-BL16) corresponding to the storage unit group 15, every two adjacent bit lines 13 are connected to different sense amplifier groups 14. As illustrated in FIG. 5, BL10, BL12, BL14, and BL16 corresponding to the storage unit group 15 are connected to the sense amplifier group Sense Amplifier<n−1>, and BL9, BL11, BL13, and BL15 are connected to the sense amplifier group Sense Amplifier<n>. With this arrangement, when two adjacent bits of erroneous data appear in the storage unit group 15, for example, when BL10 and BL11 are erroneous at the same time, the two bits of erroneous data are connected to different sense amplifier groups 14. Taking DRAM as an example, when the DRAM reads data, each sense amplifier group 14 is used as a unit. For example, the sense amplifier group Sense Amplifier<n−1> reads eight bits (BL1, BL3, BL5, BL7, BL10, BL12, BL14, and BL16) at a time, and then the sense amplifier group Sense Amplifier<n−1> sends the output data to an ECC module or sends the output data to the ECC module after other processing circuits process the output data. The ECC has the detection and correction capability of a 1 bit error. Then when two adjacent bits are erroneous, because two adjacent bit lines are connected to different sense amplifier groups, the reading of 2 bits error may be divided into twice, and only a 1 bit error is read at a time. Therefore, every 1 bit error may be detected and corrected, so that the error of two adjacent bits is detected and corrected.

Figure 6:
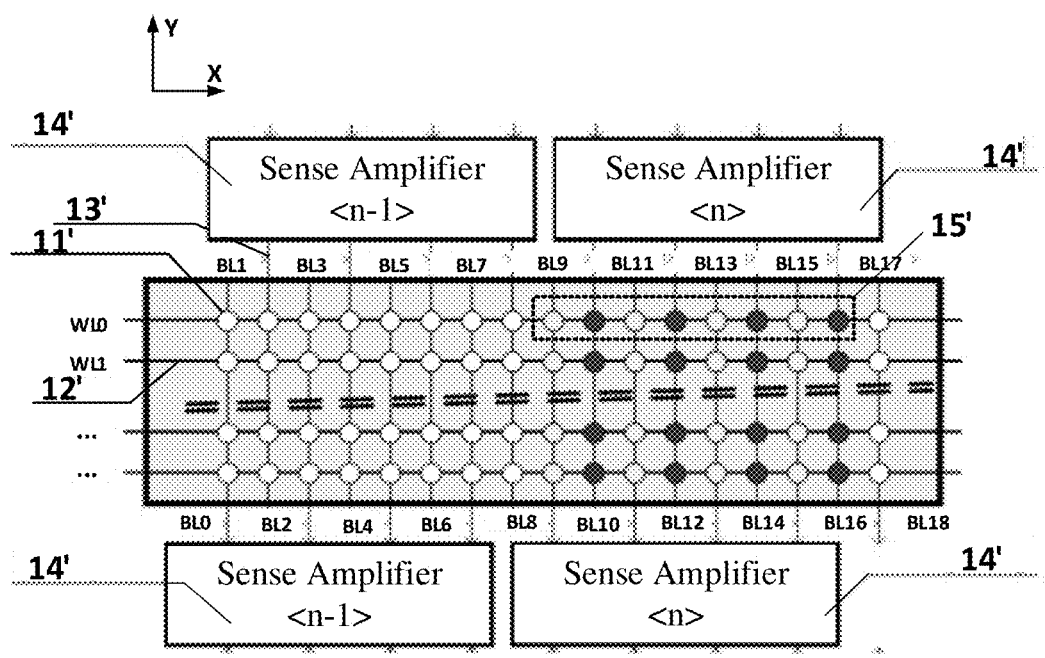
FIG. 6 is a schematic structure diagram of a comparative embodiment of a bit line sense circuit provided by an embodiment of the present application.

FIG. 6 is a schematic structure diagram of a comparative embodiment of a bit line sense circuit provided by an embodiment of the present application. In the comparative embodiment, BL9, BL10, BL11, BL12, BL13, BL14, BL15, and BL16 corresponding to a storage unit group 15' are all connected to the sense amplifier group Sense Amplifier<n>. When two adjacent bits are erroneous, for example, when BL10 and BL11 are erroneous at the same time, the two bits of erroneous data are connected to the sense amplifier group Sense Amplifier<n>. Taking DRAM as an example, when the DRAM reads data, each sense amplifier group 14 is used as a unit. For example, the sense amplifier group Sense Amplifier<n> reads eight bits (BL9, BL10, BL11, BL12, BL13, BL14, BL15, and BL16) at a time, and then the sense amplifier group Sense Amplifier<n> sends the output data to an ECC module or sends the output data to the ECC module after other processing circuits process the output data. The ECC has the detection and correction capability of a 1 bit error. Then when two adjacent bits are erroneous, the detection and correction capability of the existing ECC is exceeded, resulting in DRAM reading errors.

With continued reference to FIG. 5, in some embodiments of the present application, each sense amplifier group 14 may include a first sense amplifier 14a and a second sense amplifier 14b. The first sense amplifier 14a is located on a first side of the storage unit array along the word line direction X. The second sense amplifier 14b is located on a second side of the storage unit array which is opposite to the first side along the word line direction X. The first sense amplifier and the second sense amplifier are both connected to P bit lines. H is a positive even multiple of P. For example, the first sense amplifier 14a in the sense amplifier group Sense Amplifier<n> is connected to four bit lines BL9, BL11, BL13, and BL15, and the second sense amplifier 14b in the sense amplifier group Sense Amplifier<n> is connected to four bit lines BL2, BL4, BL6, and BL8.

In order to prevent input ends of the sense amplifier group 14 connected to the bit lines 13 from being arranged too densely, the sense amplifier group 14 may be divided into two parts: a first sense amplifier 14a and a second sense amplifier 14b. The first sense amplifier 14a and the second sense amplifier 14b are respectively disposed on two opposite sides of the storage unit array along the word line direction X. The first sense amplifier 14a is disposed on the first side of the storage unit array. The second sense amplifier 14b is disposed on the second side of the storage unit array. The first sense amplifier 14a is connected to a half of the bit lines corresponding to the sense amplifier group 14 (Sense Amplifier<n−1>), such as BL1, BL3, BL5, and BL7. The second sense amplifier 14b is connected to the other half of the bit lines corresponding to the sense amplifier group 14 (Sense Amplifier<n−1>), such as BL10, BL12, BL14, and BL16. For another example, as illustrated in FIG. 5, the first sense amplifier 14a in the sense amplifier group Sense Amplifier<n> is connected to four bit lines 13 BL2, BL4, BL6, and BL8, and the second sense amplifier 14b in the sense amplifier group Sense Amplifier<n> is connected to four bit lines 13 BL9, BL11, BL13, and BL15.

In some embodiments of the present application, with continued reference to FIG. 5, the first sense amplifier 14a and the second sense amplifier 14b in each sense amplifier group 14 are arranged in a staggered manner along the word line direction X, which facilitates the connection of the first sense amplifier 14a and the second sense amplifier 14b in each sense amplifier group 14 to the bit lines 13 of different storage unit groups. Referring to FIG. 5, for example, the first sense amplifier 14a in the Sense Amplifier<n> is connected to four bit lines BL9, BL11, BL13, and BL15, and the second sense amplifier 14b in the Sense Amplifier<n> is connected to four bit lines BL2, BL4, BL6, and BL8. The first sense amplifier 14a and the second sense amplifier 14b in the Sense Amplifier<n> are projected onto a word line WL0, and do not overlap, that is, are staggered along the word line direction X. The first sense amplifier 14a and the second sense amplifier 14b in the Sense Amplifier <n−1> are projected onto the word line WL0, and do not overlap, that is, are staggered along the word line direction X.

In some embodiments of the present application, with continued reference to FIG. 5, the number of the sense amplifier groups 14 may be the same as the number of the storage unit groups in each row. The first sense amplifier 14a in each sense amplifier group 14 is connected to odd or even columns of bit lines in the corresponding storage unit group, and the second sense amplifier 14b in each sense amplifier group 14 is connected to even or odd columns of bit lines in the corresponding storage unit group in each row. In the same row of storage unit groups, the storage unit group corresponding to the first sense amplifier 14a in each sense amplifier group 14 is different from the storage unit group corresponding to the second sense amplifier 14b in the sense amplifier group 14.

As illustrated in FIG. 5, in each row of storage units, one storage unit group 16 corresponds to bit lines BL1-BL8, and another storage unit group 15 corresponds to bit lines BL9-BL16. The number of the sense amplifier groups 14 may be the same as the number of the storage unit groups in each row. The first sense amplifier 14a in the sense amplifier group 14 may be connected to an odd column of bit lines in the corresponding storage unit group, and the second sense amplifier 14b may be connected to an even column of bit lines in the corresponding storage unit group. Alternatively, the first sense amplifier 14a in the sense amplifier group 14 may be connected to an even column of bit lines in the corresponding storage unit group, and the second sense amplifier 14b may be connected to an odd column of bit lines in the corresponding storage unit group. It should be noted that the storage unit group connected to the first sense amplifier 14a in each sense amplifier group 14 is different from the storage unit group connected to the second sense amplifier 14b, so that adjacent 2 bit errors are transmitted to different sense amplifier groups. For example, the first sense amplifier 14a in the Sense Amplifier<n> is connected to a storage unit group 15, and the second sense amplifier 14b in the Sense Amplifier<n> is connected to a storage unit group 16. Exemplarily, the first sense amplifier 14a in the sense amplifier group Sense Amplifier<n-1> is connected to bit lines BL2, BL4, BL6, and BL8 corresponding to a storage unit group, and the second sense amplifier 14b in the sense amplifier group Sense Amplifier<n-1> is connected to bit lines BL9, BL11, BL13, and BL15 corresponding to another storage unit group.

Figure 7:
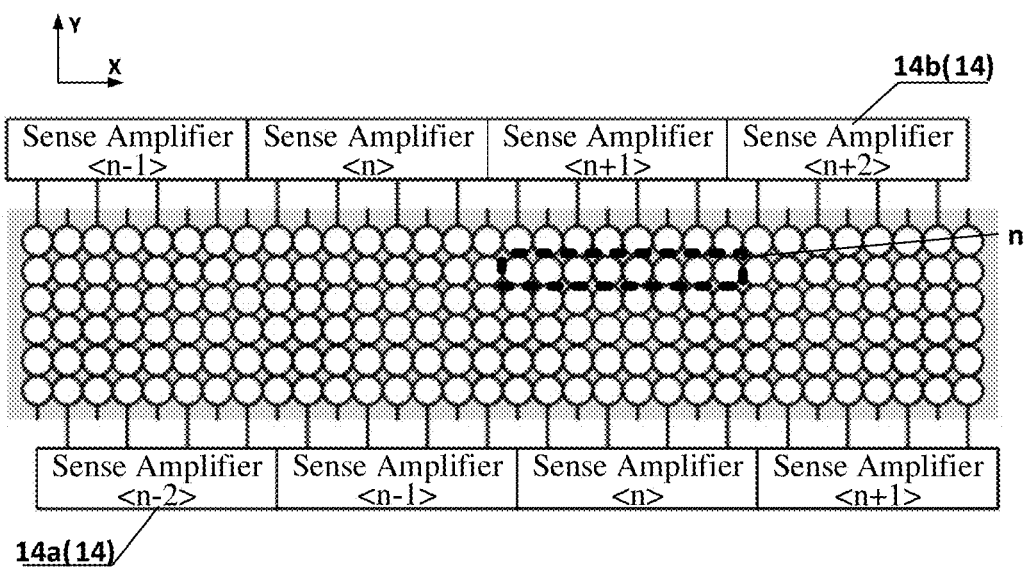
FIG. 7 is a schematic structure diagram of another bit line sense circuit provided by an embodiment of the present application.

Referring to FIG. 7, FIG. 7 is a schematic structure diagram of another bit line sense circuit provided by an embodiment of the present application. In some embodiments of the present application, the first sense amplifiers 14a are arranged on the first side of the storage unit array along the word line direction X, and are sequentially arranged. For example, a Sense Amplifier<n-2>, a Sense Amplifier<n-1>, a Sense Amplifier<n>, and a Sense Amplifier<n+1> are sequentially arranged. The second sense amplifiers 14b are arranged on the second side opposite to the first side, and are sequentially arranged. For example, a Sense Amplifier<n-1>, a Sense Amplifier<n>, a Sense Amplifier<n+1>, and a Sense Amplifier<n+2> are sequentially disposed. The same sense amplifier group 14, such as the Sense Amplifier<n>, includes a first sense amplifier and a second amplifier that are still staggered along the word line direction X.

With continued reference to FIG. 7, in some embodiments of the present application, the first sense amplifier 14a in the $n^{th}$ sense amplifier group 14 is connected to odd or even columns of bit lines in the $n^{th}$ storage unit group along the word line direction X, and the second sense amplifier 14b in the $n+i^{th}$ sense amplifier group 14 is connected to even or odd columns of bit lines in the $n^{th}$ storage unit group along the word line direction X. Both n and i are integers. For example, the situation that i is 1 is illustrated in FIG. 7. It should be noted that i may also be 2 or 3 or other integers, which is not limited herein.

With continued reference to FIG. 7, the first sense amplifier 14a in the $n^{th}$ sense amplifier group 14 may be connected to odd or even columns of bit lines in the $n^{th}$ storage unit group along the word line direction X, and the second sense amplifier 14b in the $n+1^{th}$ sense amplifier group 14 may be connected to even or odd columns of bit lines in the $n^{th}$ storage unit group. The first sense amplifier 14a and the second sense amplifier 14b in each sense amplifier group 14 are arranged in a staggered manner along the word line direction X. For example, the first sense amplifier 14a in the sense amplifier group Sense Amplifier<n> and the second sense amplifier 14b in the sense amplifier group Sense Amplifier<n> do not overlap in the word line direction x, that is, are staggered.

Figure 8:
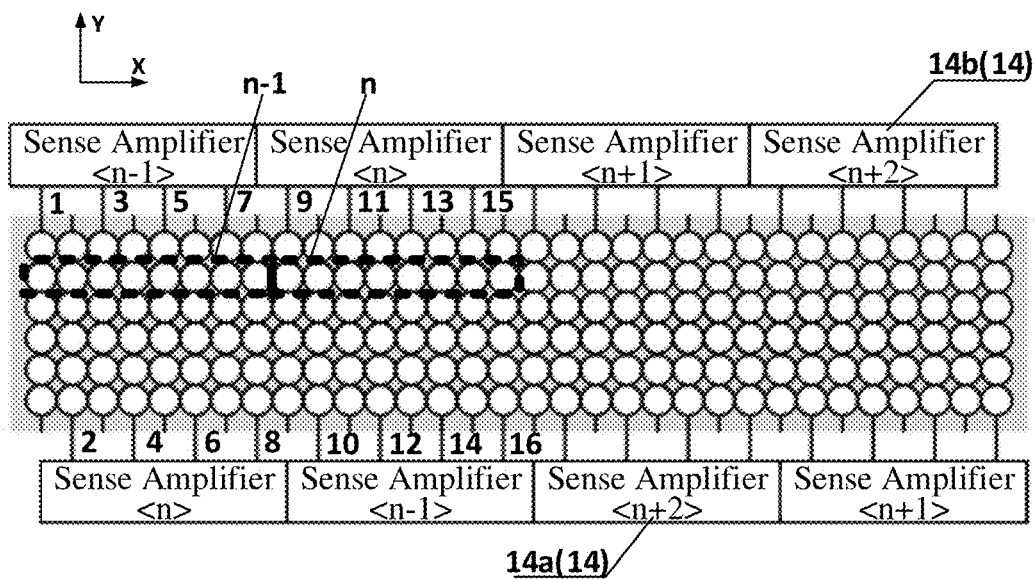
FIG. 8 is a schematic structure diagram of another bit line sense circuit provided by an embodiment of the present application.

As illustrated in FIG. 8, FIG. 8 is a schematic structure diagram of another bit line sense circuit provided by an embodiment of the present application. In some embodiments of the present application, the first sense amplifier 14a in the $n^{th}$ sense amplifier group 14 is connected to odd or even columns of bit lines in the $n-1^{th}$ storage unit group along the word line direction. The second sense amplifier 14b in the $n-1^{th}$ sense amplifier group 14 is connected to even or odd columns of bit lines in the $n-1^{th}$ storage unit group along the word line direction. The second sense amplifier 14b in the $n^{th}$ sense amplifier group 14 is connected to even or odd columns of bit lines in the $n^{th}$ storage unit group along the word line direction X. The first sense amplifier 14a in the $n-1^{th}$ sense amplifier group 14 is connected to odd or even columns of bit lines in the $n^{th}$ storage unit group along the word line direction X, and n is a positive integer. For example, the first sense amplifier 14a in the Sense Amplifier<n> is connected to even columns (BL2, BL4, BL6, and BL8) of the $n-1^{th}$ storage unit group, and the second sense amplifier 14b in the Sense Amplifier<n-1> is connected to odd columns (BL1, BL3, BL5, and BL7) of the $n-1^{th}$ storage unit group. The second sense amplifier 14b in the Sense Amplifier<n> is connected to odd columns (BL9, BL11, BL13, and BL15) of the $n^{th}$ storage unit group, and the first sense amplifier 14a in the Sense Amplifier<n> is connected to even columns (BL10, BL12, BL14, and BL16) of the $n^{th}$ storage unit group.

Figure 9:
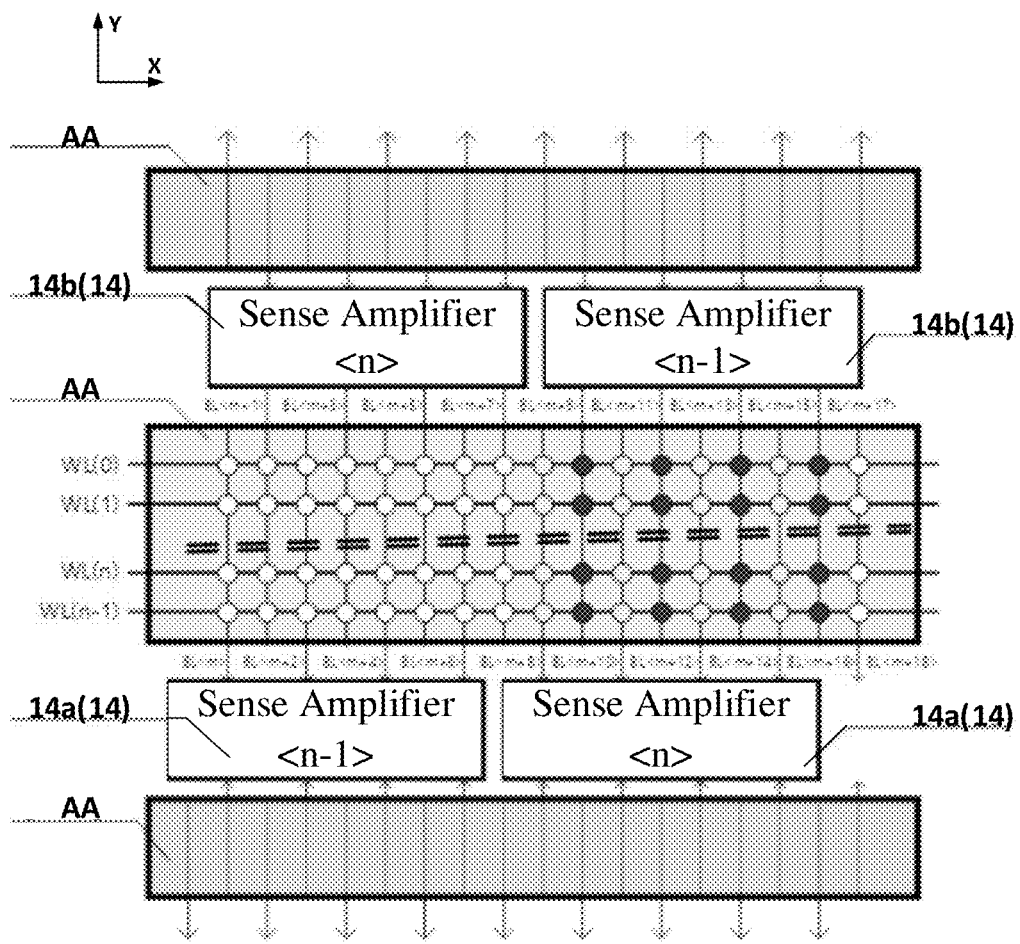
FIG. 9 is a schematic structure diagram of another bit line sense circuit provided by an embodiment of the present application.

FIG. 9 is a schematic structure diagram of another bit line sense circuit provided by an embodiment of the present application. In some embodiments of the present application, as illustrated in FIG. 9, a plurality of storage unit arrays AA are sequentially arranged along the bit line direction Y. A first sense amplifier 14a and a second sense amplifier 14b are respectively disposed on two opposite sides of each storage unit array AA along the bit line direction Y. The first sense amplifier 14a of the $t^{th}$ storage unit array AA may be multiplexed as the second sense amplifier 14b of the $t+1^{th}$ storage unit array AA along the bit line direction Y. For example, there are eight sense amplifiers in the first sense amplifier 14a in the sense amplifier group Sense Amplifier<n> in FIG. 9. Four of the sense amplifiers are connected to four bit lines of the storage unit array AA above, and the other four sense amplifiers are connected to four bit lines of the storage unit array AA below. The first sense amplifier 14a in the Sense Amplifier<n> as a whole may be multiplexed by the two storage unit arrays AA above and below. The first sense amplifier 14a in the $t+1^{th}$ storage unit array AA is multiplexed as the second sense amplifier 14b in the $t+2^{th}$ storage unit array AA. The t is a positive integer.

Figure 10:
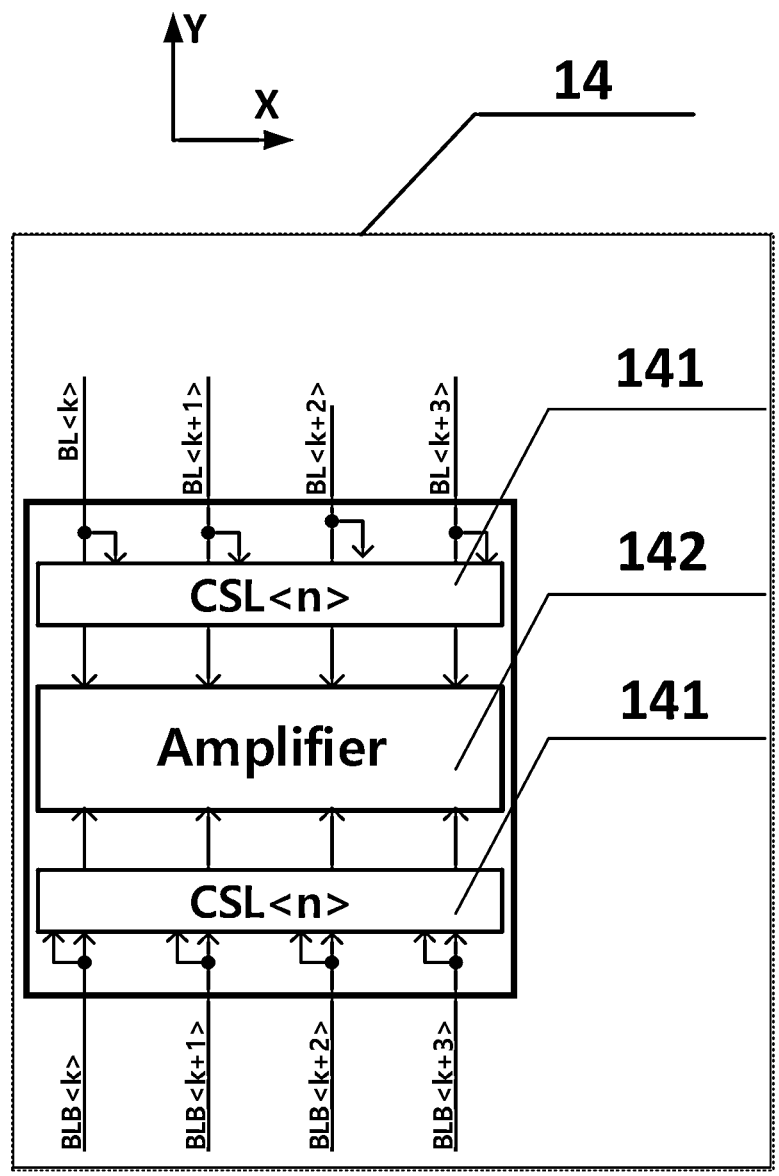
FIG. 10 is a schematic structure diagram of a first sense amplifier or a second sense amplifier provided by an embodiment of the present application.

FIG. 10 is a schematic structure diagram of a first sense amplifier or a second sense amplifier provided by an embodiment of the present application. FIG. 11 and FIG. 12 are a schematic diagram of a column select cell provided by an embodiment of the present application. In some embodiments of the present application, each first sense amplifier and each second sense amplifier respectively include column selection units 141 (denoted by CSL<n> in FIG. 10) and sense amplifiers 142 (denoted by Amplifier in FIG. 10). The column selection unit 141 may include a control end, first ends, and second ends. The first ends of each column selection unit 141 are electrically connected to the corresponding sense amplifier 142. The second ends of the column selection unit 141 are connected to another circuit, such as a second-level sense amplifier or a conversion circuit. The control end of the column selection unit 141 is connected to a decoding circuit. The column selection unit 141 may include first transistors T1. Each of the first transistors T1 includes a control end, a first end, and a second end. Taking FIG. 10 as an example, the column selection unit 141 includes four first transistors T1, and each transistor T1 is connected to the sense amplifier 142. For another example, if each storage unit group includes eight storage units, the column selection unit 141 is provided with first ends corresponding to four bit lines of the corresponding storage unit group one by one or is connected to four input and output ends of the sense amplifier 142, and the column selection unit 141 is configured to control the input and output of data of the sense amplifier 142.

Exemplarily, a memory is also provided. The memory includes technical features of the bit line sense circuit provided by any embodiment of the present application and has beneficial effects of the technical features with reference to FIGS. 1, 2, 3, 4, and 13. Each of the storage unit groups further includes one word line. The one word line and the H bit lines further correspond to H transistors and H capacitors. The one word line controls the H transistors to be turned on or off. The H bit lines are connected to first ends of the corresponding H transistors. Second ends of the H transistors are connected to first ends of the corresponding H capacitors. Second ends of the H capacitors are connected to a fixed voltage. H is an integer of 8, and both M and L are 2.

Exemplarily, with continued reference to FIG. 11, the memory further includes an ECC, which is connected to the sense amplifier groups and configured to detect the correctness of storage data output by the sense amplifiers and correct the erroneous storage data. According to the embodiment of the present application, under the condition that the error correcting capability of the existing ECC is not changed, the detection and correction of a 2 bits error in a memory are realized, and the performance of the memory is improved.

It should be noted that the above descriptions are only preferred embodiments of the present application and applied technical principles. Those skilled in the art will understand that the present application is not limited to the specific embodiments described here, and those skilled in the art can make various obvious changes, readjustments and substitutions without departing from the protection scope of the present application. Therefore, although the present application has been described in more detail through the above embodiments, the present application is not limited to the above embodiments, and can also include more other equivalent embodiments without departing from the concept of the present application. The scope of the present application is determined by the scope of the appended claims.

INDUSTRIAL APPLICABILITY

Embodiments of the present application provide a column select signal cell circuit, a bit line sense circuit and a memory. The column select signal cell circuit includes: a first column select cell, a second column select cell, a third column select cell and a fourth column select cell, respectively include 4*N input and output ports, 4*N bit line connection ports and one control port. The control ports of the first column select cell and the fourth column select cell are connected to a first column select signal, the control ports of the second column select cell and the third column select cell are connected to a second column select signal, the bit line connection ports of the first column select cell and the third column select cell are connected to 8*N bit lines of a first storage unit group, the bit line connection ports of the second column select cell and the fourth column select cell are connected to 8*N bit lines of a second storage unit group, and the first storage unit group and the second storage unit group are adjacently arranged.

According to the technical solution provided by the present application, two adjacent bit lines are connected to different sense amplifier groups, and when read errors occur simultaneously on the two adjacent bit lines, error data may be detected and corrected by an ECC. According to the technical solution provided by the present application, under the condition that the error correcting capability of the existing ECC is not changed, the detection and correction of a 2 bits error in a memory are realized, and the performance of the memory is improved.

The invention claimed is:

1. A column select signal cell circuit, comprising:
   a first column select cell, a second column select cell, a third column select cell and a fourth column select cell, each of which comprises 4*N input and output ports, 4*N bit line connection ports and one control port, wherein the control ports of the first column select cell and the fourth column select cell are electrically connected to a first column select signal, the control ports of the second column select cell and the third column select cell are electrically connected to a second column select signal, the bit line connection ports of the first column select cell and the third column select cell are respectively connected to 8*N bit lines of a first storage unit group, the bit line connection ports of the second column select cell and the fourth column select cell are respectively connected to 8*N bit lines of a second storage unit group, the first storage unit group and the second storage unit group are adjacently arranged, and N is an integer greater than or equal to 1.

2. The column select signal cell circuit of claim 1, wherein even-numbered bit lines of the first storage unit group are connected to the bit line connection ports of the first column select cell, and odd-numbered bit lines of the first storage unit group are connected to the bit line connection ports of the third column select cell; and
   even-numbered bit lines of the second storage unit group are connected to the bit line connection ports of the second column select cell, and odd-numbered bit lines of the second storage unit group are connected to the bit line connection ports of the fourth column select cells.

3. The column select signal cell circuit of claim 2, wherein the first column select cell and the second column select cell are arranged side by side;
   the third column select cell and the fourth column select cell are arranged side by side;
   the first column select cell and the third column select cell are arranged on two opposite sides of the first storage unit group;
   the second column select cell and the fourth column select cell are arranged on two opposite sides of the second storage unit group;
   the first column select cell and the second column select cell share 2*N input and output ports; and
   the third column select cell and the fourth column select cell share 2*N input and output ports.

4. A column select signal cell circuit, comprising:
   a first column select cell, a second column select cell, a third column select cell and a fourth column select cell, each of which comprises 4*N input and output ports, 4*N bit line connection ports and one control port, wherein the first column select cell is electrically connected to a first column select signal, the control ports of the second column select cell and the third column select cell are electrically connected to a second column select signal, the fourth column select cell is electrically connected to a third column select signal, the bit line connection ports of the first column select cell are respectively connected to 4*N bit lines of a first storage unit group, the bit line connection ports of the second column select cell are respectively connected to 4*N bit lines of a second storage unit group, the bit line connection ports of the third column select cell are respectively connected to another 4*N bit lines of the first storage unit group, the bit line connection ports of the fourth column select cell are respectively connected to another 4*N bit lines of the second storage unit group, the first storage unit group and the second storage unit group are adjacently arranged, and N is an integer greater than or equal to 1.

5. The column select signal cell circuit of claim 4, wherein even-numbered bit lines of the first storage unit group are connected to the bit line connection ports of the first column select cell, and odd-numbered bit lines of the first storage unit group are connected to bit line connection ports of the third column select cell; and
even-numbered bit lines of the second storage unit group are connected to the bit line connection ports of the second column select cell, and odd-numbered bit lines of the second storage unit group are connected to the bit line connection ports of the fourth column select cell.

6. The column select signal cell circuit of claim 5, wherein the first column select cell and the second column select cell are arranged side by side;
the third column select cell and the fourth column select cell are arranged side by side;
the first column select cell and the third column select cell are arranged at two opposite sides of the first storage unit group;
the second column select cell and the fourth column select cell are arranged at two opposite sides of the second storage unit group;
the first column select cell and the second column select cell share 2*N input and output ports; and
the third column select cell and the fourth column select cell share 2*N input and output ports.

7. A bit line sense circuit, comprising:
L storage unit groups, each of the L storage unit groups comprising H bit lines, and L and H being positive integers greater than or equal to 2; and
M sense amplifier groups, configured to write storage data to or read storage data from the H bit lines in the L storage unit groups, the M sense amplifier groups being electrically connected to the L storage unit groups, and M being an integer multiple of L or L being an integer multiple of M, and each of the M sense amplifier groups comprising the column select signal cell circuit of claim 1,
wherein two adjacent bit lines of the H bit lines are connected to different sense amplifier groups of the M sense amplifier groups.

8. The bit line sense circuit of claim 7, wherein H is an integer multiple of 8, and M is equal to L.

9. The bit line sense circuit of claim 7, wherein each of the M sense amplifier groups comprises a first sense amplifier and a second sense amplifier;

the L storage unit groups are arranged side by side along a word line direction, and word lines are perpendicular to the H bit lines; and
each first sense amplifier is located on one side of the L storage unit groups, and each second sense amplifier is located on an opposite side of the L storage unit groups.

10. The bit line sense circuit of claim 9, wherein the first sense amplifier and the second sense amplifier are respectively connected to P bit lines, and H is a positive even multiple of P.

11. The bit line sense circuit of claim 9, wherein the first sense amplifier and the second sense amplifier located in a same sense amplifier group of the M sense amplifier groups are arranged in a staggered manner along the word line direction.

12. The bit line sense circuit of claim 9, wherein the first sense amplifiers located in different sense amplifier groups of the M sense amplifier groups are arranged side by side along the word line direction, the second sense amplifiers located in different sense amplifier groups of the M sense amplifier groups are arranged side by side along the word line direction, and the first sense amplifier and the second sense amplifier located in a same sense amplifier group of the M sense amplifier groups are arranged in a staggered manner along the word line direction.

13. The bit line sense circuit of claim 12, wherein the first sense amplifiers located in the different sense amplifier groups are sequentially arranged along the word line direction, and the second sense amplifiers located in the different sense amplifier groups are sequentially arranged along the word line direction.

14. The bit line sense circuit of claim 12, wherein two adjacent first sense amplifiers and two adjacent second sense amplifiers located in two sense amplifier groups of the M sense amplifier groups are arranged in a crossed manner.

15. The bit line sense circuit of claim 12, wherein in the same sense amplifier group, the first sense amplifier is connected to odd or even columns of bit lines, and the second sense amplifier is connected to even or odd columns of bit lines.

16. The bit line sense circuit of claim 9, wherein in storage unit groups of the L storage unit groups connected to a same word line, a storage unit group corresponding to the first sense amplifier is different from a storage unit group corresponding to the second sense amplifier in a same sense amplifier group of the M sense amplifier groups.

17. The bit line sense circuit of claim 9, wherein the first sense amplifier in an $n^{th}$ sense amplifier group of the M sense amplifier groups is connected to odd or even columns of bit lines in an $n^{th}$ storage unit group of the L storage unit groups along the word line direction, the second sense amplifier in an $n+i^{th}$ sense amplifier group of the M sense amplifier groups is connected to even or odd columns of bit lines in the $n^{th}$ storage unit group along the word line direction, and both n and i are integers greater than or equal to 1 and less than or equal to L.

18. The bit line sense circuit of claim 9, wherein the first sense amplifier in an $n^{th}$ sense amplifier group of the M sense amplifier groups is connected to odd or even columns of bit lines in an $n^{th}$ storage unit group of the L storage unit groups along the word line direction, the second sense amplifier in an $n-1^{th}$ sense amplifier group of the M sense amplifier groups is connected to even or odd columns of bit lines in the $n^{th}$ storage unit group along the word line direction, the first sense amplifier in the $n-1^{th}$ sense amplifier group is connected to odd or even columns of bit lines in an $n-1^{th}$ storage unit group of the L storage unit groups along the word line direction, the second sense amplifier in the $n^{th}$ sense amplifier group is connected to even or odd columns of bit lines in the $n-1^{th}$ storage unit group along the word line direction, and n is an integer greater than or equal to 2 and less than or equal to L.

19. The bit line sense circuit of claim 9, wherein the first sense amplifier and the second sense amplifier respectively comprise H/2 column selection units and H/2 sense amplifiers, H is an even number, and the sense amplifiers correspond to the H bit lines one by one and corresponds to the column selection units one by one;
- the sense amplifiers are connected to the H bit lines and configured to amplify the write storage data or amplify the read storage data; and
- the column selection units are connected to the sense amplifiers and configured to control transmission of the write storage data or the read storage data.

20. A memory, comprising:
the bit line sense circuit of claim 7, wherein
each of the L storage unit groups further comprises one word line, the one word line and the H bit lines further correspond to H transistors and H capacitors, the one word line controls the H transistors to be turned on or off, the H bit lines are connected to first ends of the H transistors, second ends of the H transistors are connected to first ends of the H capacitors, and second ends of the H capacitors are connected to a fixed voltage.

* * * * *